United States Patent
Rajagopal et al.

(10) Patent No.: US 8,204,460 B2
(45) Date of Patent: Jun. 19, 2012

(54) METHOD AND SYSTEM FOR PRECISE TRANSMIT POWER ADJUSTMENT IN WIRELESS COMMUNICATION SYSTEMS

(75) Inventors: Sridhar Rajagopal, Plano, TX (US); Brian Chadwick Joseph, McKinney, TX (US)

(73) Assignee: QUALCOMM Incorporated, San Diego, CA (US)

( * ) Notice: Subject to any disclaimer, the term of this patent is extended or adjusted under 35 U.S.C. 154(b) by 1205 days.

(21) Appl. No.: 11/835,924

(22) Filed: Aug. 8, 2007

(65) Prior Publication Data

US 2009/0042525 A1 Feb. 12, 2009

(51) Int. Cl.
*H01Q 11/12* (2006.01)
*H04B 1/04* (2006.01)

(52) U.S. Cl. ...... 455/127.2; 455/522; 455/69; 455/13.4; 455/127.5; 370/318; 375/219; 330/124 R

(58) Field of Classification Search ........... 455/232.1, 455/522, 69, 13.4, 127.1, 233.1, 234.1, 240.1, 455/127.2, 126, 127.5; 370/318; 375/219, 375/297; 330/124 R
See application file for complete search history.

(56) References Cited

U.S. PATENT DOCUMENTS

| | | | | |
|---|---|---|---|---|
| 5,990,738 | A * | 11/1999 | Wright et al. | 330/149 |
| 6,226,316 | B1 * | 5/2001 | Schilling et al. | 375/142 |
| 6,952,132 | B2 * | 10/2005 | Bhattacharjee et al. | 330/140 |
| 7,184,722 | B1 | 2/2007 | Johnson et al. | |
| 2002/0137536 | A1 | 9/2002 | Aisaka et al. | |
| 2003/0040290 | A1 * | 2/2003 | Sahlman et al. | 455/115 |
| 2004/0219944 | A1 * | 11/2004 | Barak et al. | 455/522 |
| 2005/0130687 | A1 * | 6/2005 | Filipovic et al. | 455/522 |
| 2005/0254442 | A1 * | 11/2005 | Proctor et al. | 370/294 |
| 2005/0270095 | A1 * | 12/2005 | Burke et al. | 330/124 R |
| 2006/0068733 | A1 * | 3/2006 | Wang et al. | 455/234.1 |
| 2006/0166692 | A1 * | 7/2006 | Waltho et al. | 455/522 |
| 2007/0054699 | A1 | 3/2007 | Ding et al. | |
| 2009/0219098 | A1 * | 9/2009 | Rofougaran | 330/278 |

FOREIGN PATENT DOCUMENTS

| | | |
|---|---|---|
| EP | 1763129 A1 | 3/2007 |
| JP | 2933609 B1 | 8/1999 |
| JP | 11340908 | 12/1999 |
| JP | 2002141812 A | 5/2002 |
| JP | 2002290262 A | 10/2002 |
| JP | 2006020244 A | 1/2006 |
| KR | 20000005382 A | 1/2000 |
| KR | 20060023845 A | 3/2006 |
| WO | WO2007087639 | 8/2007 |

OTHER PUBLICATIONS

International Patent Cooperation Treaty Search Report and Written Opinion of the International Searching Authority for Patent Cooperation Treaty Application No. PCT/US2008/071237 dated Oct. 16, 2008, pp. 1-11.

* cited by examiner

*Primary Examiner* — Shaima Q Aminzay
(74) *Attorney, Agent, or Firm* — Nicholas J. Pauley; Peter M. Kamarchik; Jonathan T. Velasco

(57) ABSTRACT

A method for precise transmit power adjustment in a wide personal area network (WPAN) is provided that includes coarse adjusting a power level of the radio signal by adjusting a gain setting of an amplifier that is used to power the radio signal, and fine adjusting the power level of the radio signal by adjusting a voltage level of an information signal that is provided to the amplifier so that the power level of the radio signal approaches a maximum allowable power level.

30 Claims, 5 Drawing Sheets

METHOD AND SYSTEM FOR PRECISE TRANSMIT POWER ADJUSTMENT IN WIRELESS COMMUNICATION SYSTEMS

BACKGROUND

The present disclosure relates generally to wireless communication systems and, more particularly, to a method and apparatus for precise transmit power adjustment in a wireless communication system.

In any wireless communication system, there is a transmitter and a receiver. Regulatory bodies such as the Federal Communication Commissions (FCC) have established regulations that specify a maximum transmit power for the transmitter of various wireless communication systems. Some wireless communication systems such as cellular or mobile communication systems do not need to transmit radio signals at peak power levels since they have sufficient power allocated in their frequency spectrum to operate at long distances. Also, a small increase in the transmit power of these long range systems does not provide additional range that makes a difference in the overall coverage of the system, relatively speaking. As such, these systems do not require fine gain resolution for the power amplifier of the transmitter and thus, the power amplifier gain resolution is optimized to about 1.0 dB accuracy.

However, other wireless communication systems such as ultra-wideband (UWB) communication systems implemented in a wireless personal area network (WPAN) operate at very low power levels and spread the transmit power across a wide bandwidth. In order to maximize their communication range, UWB systems need to transmit radio signals at a maximum power level allowed by regulations. The process for accurately adjusting the transmit power in these wireless communication systems is difficult since the power amplifier of the transmitter does not have good gain resolution and dynamic range simultaneously. This process becomes even more complex due to variations of the power amplifier over temperature as well as voltage and process fluctuations. Therefore, it would be desirable to have a method and system for precise transmit power adjustments in UWB communication systems.

SUMMARY OF THE INVENTION

One of the broader forms of the invention involves a method for precise transmit power adjustment of a radio signal in a wide personal area network (WPAN) that includes coarse adjusting a power level of the radio signal by adjusting a gain setting of an amplifier that is used to power the radio signal, and fine adjusting the power level of the radio signal by adjusting a voltage level of an information signal that is provided to the amplifier so that the power level of the radio signal approaches a maximum allowable power level.

Another of the broader forms of the invention involves a computer-readable medium having computer-executable instructions for precise transmit power adjustment of a radio signal in a WPAN that includes instructions for coarse adjusting a power level of the radio signal by adjusting a gain setting of an amplifier that is used to power the radio signal, and instructions for fine adjusting the power level of the radio signal by adjusting a voltage level of an information signal that is provided to the amplifier so that the power level of the radio signal approaches a maximum allowable power level.

Still another of the broader forms of the invention involves an ultra-wideband (UWB) system that includes a digital multiplier for providing a digital baseband signal; a digital-to-analog converter (DAC) coupled to the digital multiplier, the DAC receiving the digital baseband signal and generating an information signal; an amplifier coupled to the DAC, the amplifier receiving the information signal and powering a radio signal, the amplifier having a gain setting that controls an output power level of the amplifier; and a memory having instructions for coarse adjusting a power level of the radio signal by adjusting the gain setting of the amplifier, and instructions for fine adjusting the power level of the radio signal by adjusting a voltage level of the information signal so that the power level of the radio signal approaches a maximum allowable power level.

BRIEF DESCRIPTION OF THE DRAWINGS

Aspects of the present disclosure are best understood from the following detailed description when read with the accompanying figures, in which:

FIG. 2 is a diagrammatic view of a plurality of bands in an UWB frequency spectrum in which the UWB system of FIG. 1 operates in.

DETAILED DESCRIPTION

Figure 1:
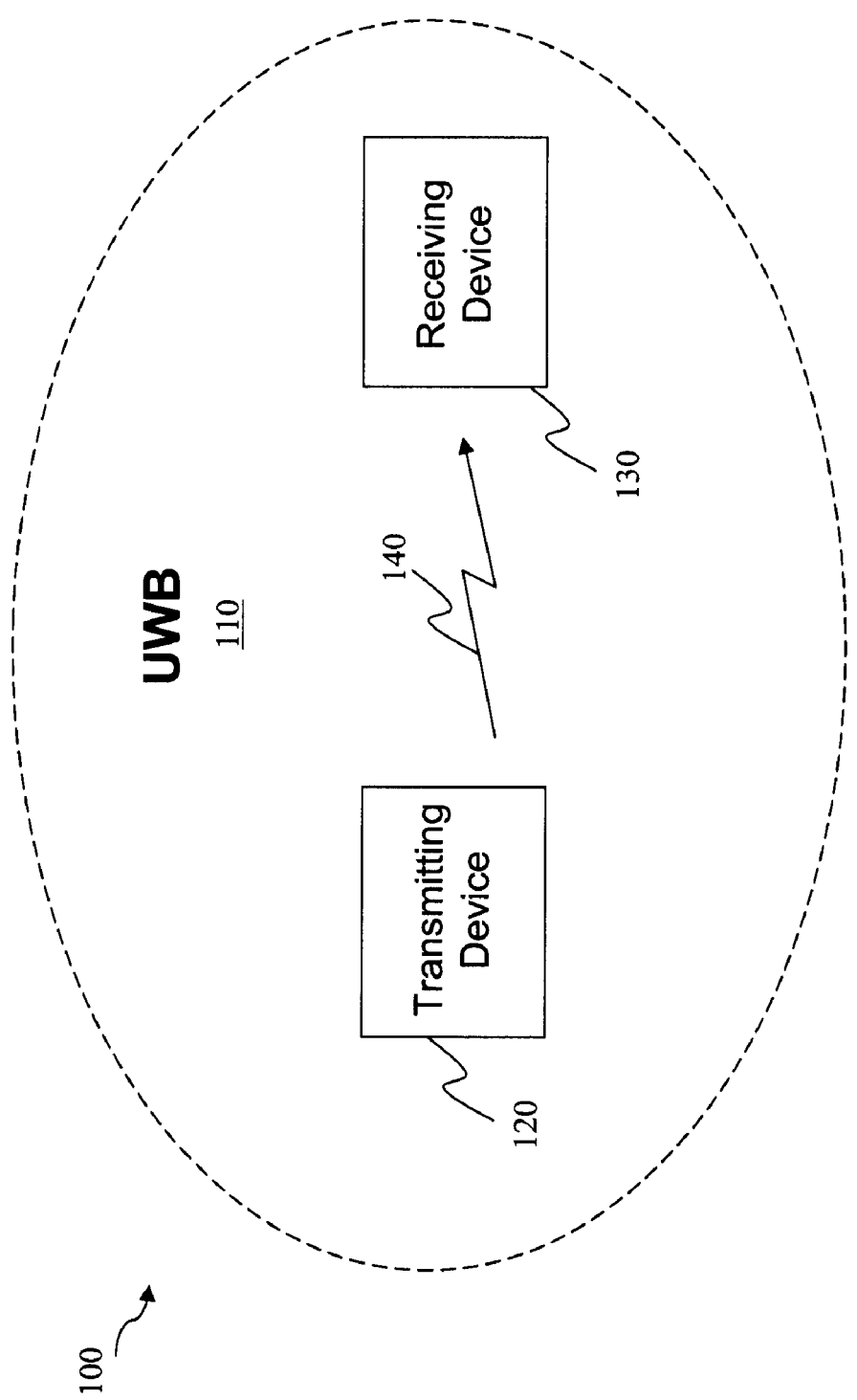
FIG. 1 is a diagrammatic view of a wireless personal area network (WPAN) implemented as an ultra-wideband (UWB) system in which embodiments disclosed herein may be implemented.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, illustrated is a diagrammatic view of a wireless personal area network (WPAN) 100 in which embodiments disclosed herein may be implemented. The WPAN 100 is implemented as an ultra-wideband (UWB) system 110. The UWB system 110 provides for wireless communications among various UWB-enabled devices and may additionally interface with higher level networks such as the Internet. In the UWB system 110, the communication distances are generally over short ranges (e.g., ten meters). The UWB system 110 includes a transmitting device 120 for transmitting data to a receiving device 130 over an UWB communication link or channel 140.

The transmitting device 120 may utilize an orthogonal frequency-division multiplexing (OFDM) scheme for transmitting information. OFDM is a form of wireless multi-carrier modulation wherein carrier spacing is selected so that each sub-carrier is orthogonal to the other sub-carriers. This orthogonality avoids adjacent channel interference and prevents the demodulators from seeing frequencies other than their own. The OFDM signal includes a plurality of sub-carriers, each sub-carrier is modulated with a conventional modulation scheme (e.g., quadrature amplitude modulation). In the UWB system 110 of the disclosed embodiment, the OFDM signal includes 128 sub-carriers (also referred to as tones) that are used per band, of which, 100 are data sub-carriers, 12 are for pilot information, 10 are guard tones, and 6 are null tones carrying no information.

Figure 2:
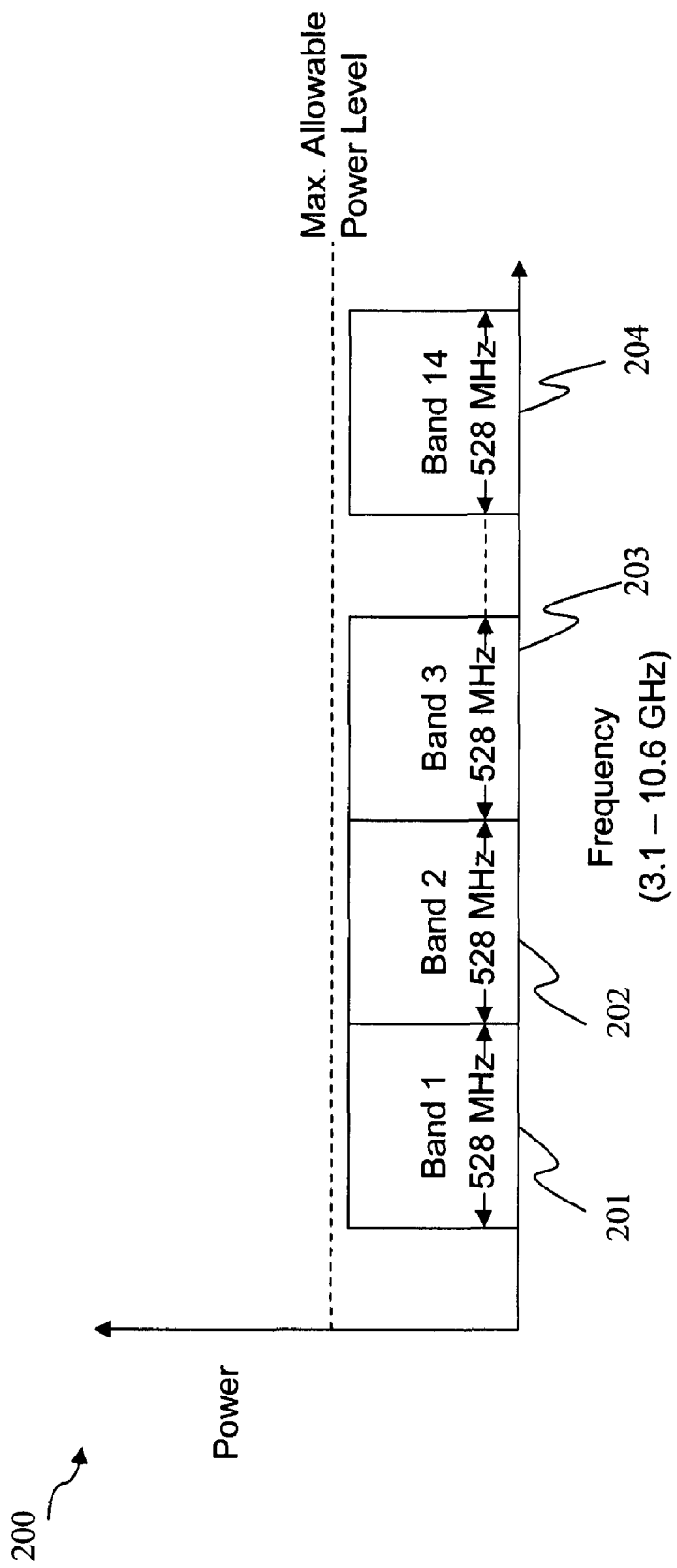

Referring to FIG. 2, illustrated is a diagrammatic view of a plurality of bands in an UWB frequency spectrum 200 in which the UWB system 110 of FIG. 1 may operate in. The UWB system 110 utilizes an unlicensed frequency spectrum between 3.1 and 10.6 GHz. The UWB system 110 includes a Physical (PHY) Layer that complies with standards such as WiMedia or ECMA-368/369. The PHY Layer divides the UWB spectrum 200 into fourteen bands 201-204, each with a bandwidth of 528 MHz. The fourteen bands 201-204 are further defined into five band groups, of which, four band groups each comprise three bands and one band group comprises two bands. Within each of the first four band groups, the PHY Layer defines four time frequency codes (TFC) using time frequency interleaving (TFI) and three TFC using fixed frequency interleaving (FFI), and thus, the PHY Layer provides support for up to seven channels per band. In the fifth band group, the PHY Layer defines two TFC using FFI. Accordingly, a total of thirty channels are specified in the PHY Layer.

For the UWB system 110, the FCC has established regulations that require UWB transmitting devices such as the transmitting device 120 of FIG. 1 to transmit at a maximum power spectral density of −41.3 dBm/Mhz. This translates to a maximum allowable power level of about −15 dBm for any given channel. Even though an average power of the transmitted radio signal is below the maximum allowable power level, a peak power level of the transmitted radio signal must also be below the maximum allowable power level. It is understood that the maximum allowable power level disclosed herein is an example and that the maximum allowable power level will depend on the country in which the UWB system is implemented in.

Figure 3:
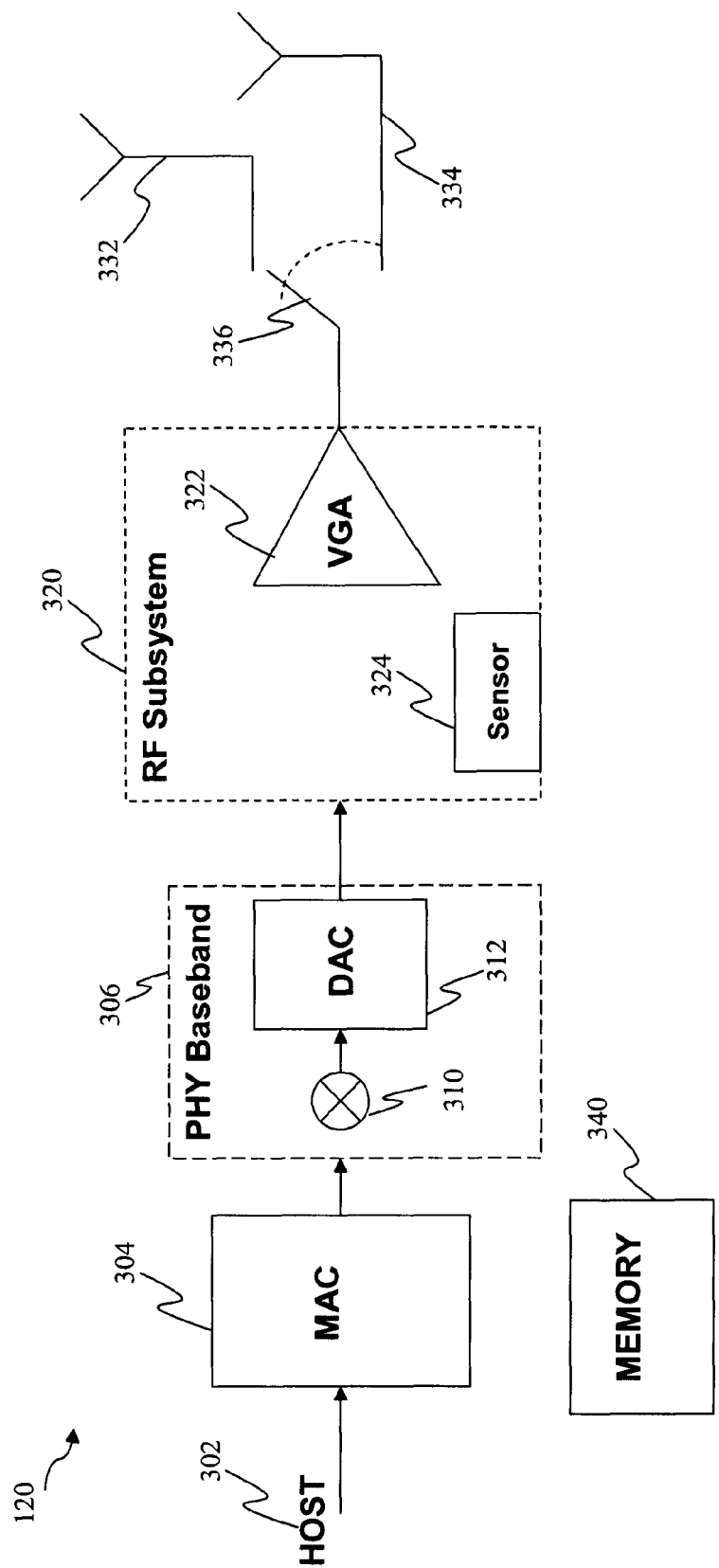
FIG. 3 is a simplified diagrammatic view of a transmitting device that may be used in the UWB system of FIG. 1.

Referring to FIG. 3, illustrated is a simplified diagrammatic view of the transmitting device 120 of FIG. 1. The transmitting device 120 includes a Host subsystem 302 that provides data such as video data to be transmitted over the UWB link. The Host subsystem 302 provides the data to a Medium Access Control (MAC) subsystem 304. The MAC subsystem 304 may comply with standards such as WiMedia or ECMA-368/369. The MAC subsystem 302 provides an interface between the Host subsystem 302 and a PHY baseband subsystem 306. The MAC subsystem generates digital data in a required format for the PHY baseband subsystem 306.

As previously described, the PHY baseband subsystem 306 is configured with a PHY Layer that may comply with standards such as WiMedia or ECMA-368/369. The PHY baseband subsystem 306 receives the digital data from the MAC 304 and processes the digital data into an information signal that is in a transmittable format. The PHY baseband subsystem 306 includes a programmable digital multiplier 310 for scaling an input signal (e.g., digital baseband signal) to a digital-to-analog converter (DAC) 312. The DAC converts the digital input signal into an analog information signal which is provided to an RF subsystem 320 for transmission. It is understood that the MAC and PHY subsystems may be implemented as an integrated circuit.

The RF subsystem 320 receives the information signal and processes it to generate a radio signal. As previously described, the transmitting device 120 utilizes an orthogonal frequency-division multiplexing (OFDM) scheme for transmitting information. The radio signal is inputted to a variable gain amplifier (VGA) 322 for powering the radio signal for transmission. The VGA 322 includes a dynamic range of about 20 dB. However, it is difficult to have an amplifier with a wide dynamic range and good resolution simultaneously. As such, the VGA 322 includes a gain resolution of about 1 to 2 dB step size. The VGA 322 is an analog component and is subject to gain variations over temperature as well as voltage and process fluctuations. For example, it has been observed that the VGA 322 experiences gain variation of up to 5 dB in worst cases. The RF subsystem 320 includes a sensor 324 such as a temperature sensor for measuring the temperature of the RF subsystem. For changes in temperature, the VGA 322 will be adjusted accordingly to compensate for the gain variations as will be explained in detail later. Alternatively, the sensor 324 may optionally include a power sensor instead of the temperature sensor for measuring the change in the power level of the radio signal coming from the VGA 322. Further, the sensor may also include a voltage sensor instead of the temperature sensor for measuring the change in the voltage level of the radio signal coming from the VGA 322.

The transmitting device 120 includes a multiple antennal system having a first antenna 332 and a second antenna 334. The transmitting device 120 includes a switch 336 for selectively driving the radio signal through the first antenna 332 or second antenna 334. The transmitting device 120 further includes memory 340 having software algorithms and data tables for operating and controlling the various components of the transmitting device as will be explained in detail later. It is understood that the transmitting device 120 includes various other components or functions known in the art such as clocks, mixers, and filters, and that the illustrated transmitted device 120 is simplified to facilitate a better understanding of the disclosed embodiments. In order for the transmitting device 120 to have a maximum communication range within the WPAN 100, it must transmit the radio signal at or as close to the maximum allowable transmit power level specified by regulations. The transmitting device can achieve this by precise transmit power adjustments during calibration and/or operation as is described in detail below.

Figure 4:
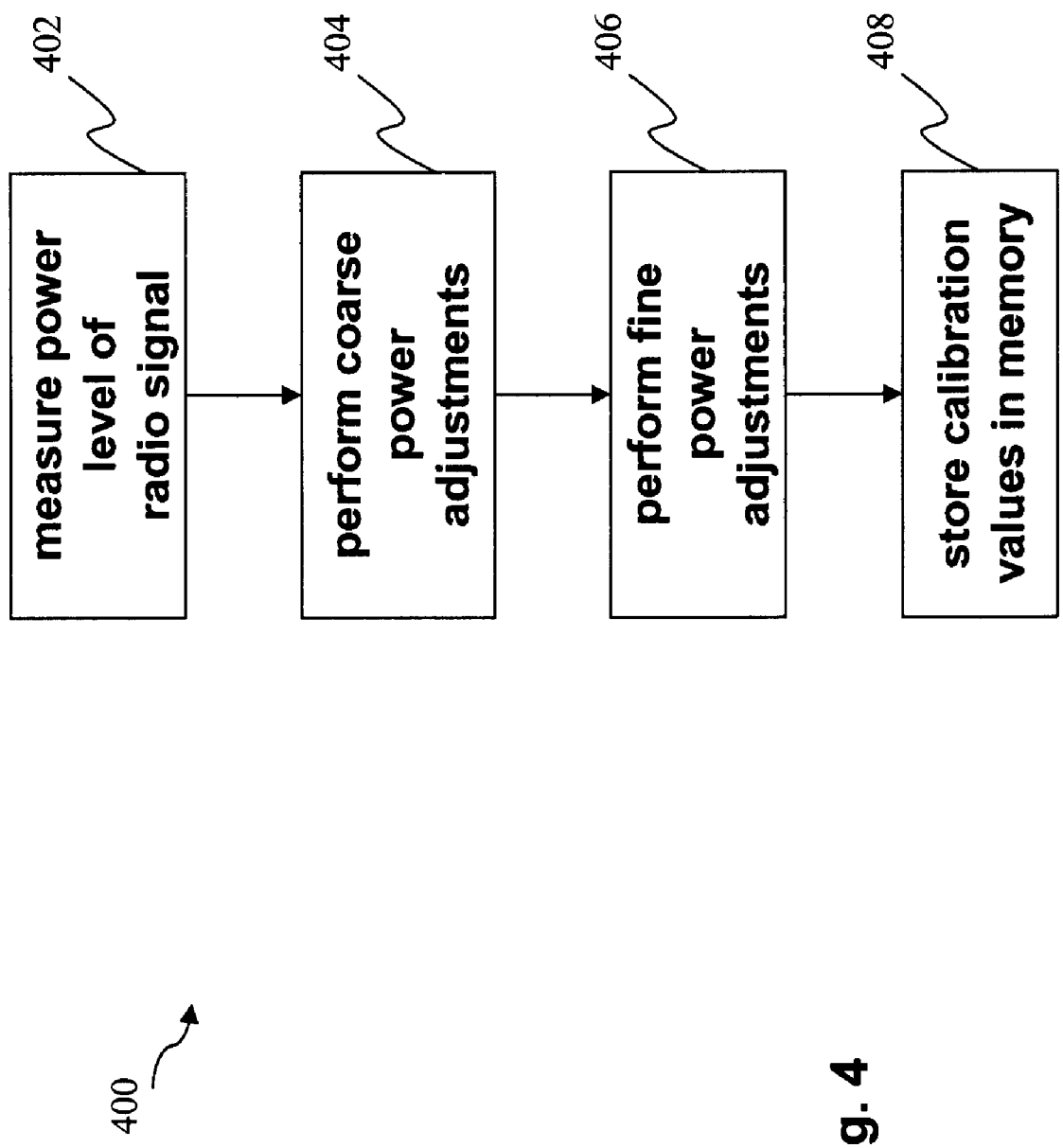
FIG. 4 is a flowchart of a method for precise transmit power adjustments that may be implemented during calibration of the transmitting device of FIG. 3.

Referring to FIG. 4, illustrated is a method 400 of precise transmit power adjustments that may be implemented during calibration of the UWB transmitting device 120 of FIGS. 1 and 3. The calibration may be performed with test equipment such as a spectrum analyzer known in the art. The calibration procedure generates default/calibration values that are stored in memory 340 and may be used during boot-up and operation of the transmitting device 120. The method 400 calibrates the transmitting device 120 to operate at or as close to a maximum allowable transmit power level specified by various regulatory bodies. The method 400 begins with step 402 in which a transmit power level is measured coming off an antenna of the transmitting device 120.

The method 400 continues with step 404 in which a coarse transmit power adjustment of the transmitting device 120 is performed by adjusting a gain setting of a variable gain amplifier (VGA) 322 in the RF subsystem 320. The transmit power level of the transmitting device 120 can be coarse adjusted in about 1 or 2 dB steps via the gain setting of the VGA 322. The RF subsystem 320 includes a 5-bit gain register (e.g., 32 gain codes) that adjusts the gain setting of the VGA 322 to about 15 dB variations. There are different gain settings for each of the different frequency bands and thus, each band can be independently compensated for the best gain setting. The RF subsystem 320 is implemented as an analog chip and thus, is subject to gain variations over temperature. As such, a temperature of the RF subsystem 320 is also measured and may be used to compensate for temperature changes as will be explained in detail later. The difference (e.g., residual error) between the measured transmit power level and the maximum allowable transmit power level may be compensated by a fine transmit power adjustment step that follows. Also, the residual error may be stored in memory and the fine power transmit power adjustment as described below may be performed during normal operation.

The method 400 continues with step 406 in which a fine transmit power adjustment is performed. The fine transmit power adjustment may be achieved through various components in the PHY baseband subsystem 306. Accordingly, the fine transmit power adjustment provides the gain to all the frequency bands equally. In the disclosed embodiment, the fine transmit power adjustment may be performed by adjusting an output voltage level of a digital-to-analog converter (DAC) 312 in the PHY baseband subsystem 306. The analog output (e.g., information signal) of the DAC 312 is inputted to the RF subsystem 320 of the transmitting device 120. As such, a change in the output voltage level of the DAC 312 causes a corresponding change in the overall transmit power level of the transmitting device 120. The DAC 312 includes a 5-bit programmable gain stage at the output of the DAC. This can provide a step size resolution of about 0.25 dB for the transmit power control.

Alternatively, the fine transmit power adjustment may optionally be performed by adjusting a programmable multiplier 310 of a baseband interpolator. The output of the programmable multiplier is fed into the input of the DAC. This programmable multiplier 310 is ideally set to maximize error vector magnitude (EVM) out the baseband. However, small variations of this multiplier may not effect EVM significantly and thus, the multiplier 310 can provide step size resolution of about 0.04 dB for the transmit power control. Additionally, the multiplier 310 is a digital component and is not subject to performance variations (e.g., temperature, voltage, and process fluctuations) as compared to the analog components (e.g., VGA) of the RF subsystem 320 which provides for better predictability and accuracy in controlling the transmit power level. In this way, the transmitting device 120 can be calibrated so that the measured transmitted power level coming off the antenna is within 0.04 dB or less of the maximum allowable power level. This provides for maximum coverage for the UWB transmitting device 120 in the WPAN 100. It is understood that the fine transmit power adjustment may also be performed by adjustments at both the DAC and the digital multiplier.

The method 400 continues with step 408 in which the calibration values that were determined in the previous steps 402-406 are stored in memory 340. These calibration values will be implemented during boot-up and operation of the transmitting device 120. Even though the method 400 is disclosed with a single antenna, it is understood that the method 400 may also be implemented in a multiple antenna system. For example, the transmitting device 120 may transmit radio signals via a first 332 or second antenna 334. As such, the first 332 and second antennas 334 can transmit at different power levels. During calibration as described above, the transmitting device 120 is calibrated with respect to the first antenna 332 to maximize the transmit power level coming off the first antenna. The maximized transmit power level associated with the first antenna 332 is noted. The transmitting device 120 is then operated with the second antenna 334. The difference in the transmit power level between the first 332 and second antenna 334 is measured and stored in memory. The transmitting device 120 includes software that automatically performs coarse and fine transmit power adjustments as described above to compensate for the power difference. Accordingly, this ensures that when an alternate antenna is used, the transmitting device 120 continues transmitting at the maximum allowable power level.

Figure 5:
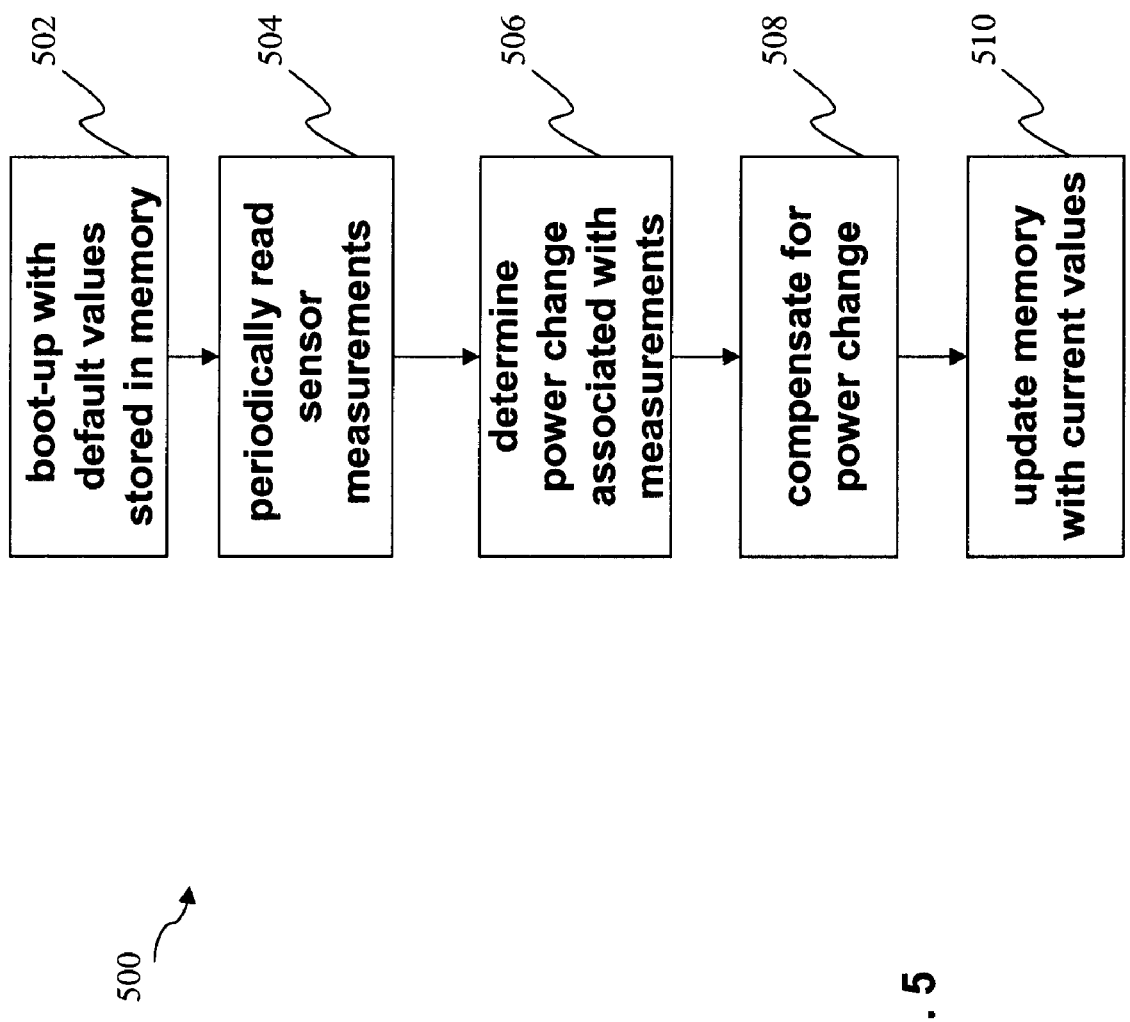
FIG. 5 is a flowchart of a method for precise transmit power adjustments that may be implemented during operation of the transmitting device of FIG. 3.

Referring to FIG. 5, illustrated is a method 500 of precise transmit power adjustments that may be implemented during operation of the UWB transmitting device 120 of FIGS. 1 and 3. As previously discussed, the UWB transmitting device 120 has been calibrated according to the method 400 of FIG. 4. The method 500 begins with step 502 in which the transmitting device 120 is booted-up using the default values that were determined during calibration and stored into memory 340. The RF subsystem 320 of the transmitting device 120 includes analog components that are extremely sensitive to temperature fluctuations as well as voltage and process fluctuations. For example, the VGA 322 may exhibit gain variations of up to 5 dB when heat is built up and the temperature of the RF subsystem 320 increases. This is significant for the disclosed UWB system 110 in that 6 dB more power means that the transmitting device 120 can transmit twice as far, or 6 dB less power means the transmitting device can transmit half as far. Additionally, there is a danger that the transmitting device 120 may exceed the maximum allowable transmit power level and thereby making the device non-compliant with regulations.

The method 500 continues with step 504 in which a sensor 324 such as a temperature sensor is periodically checked for a current temperature of the RF subsystem 320. The time period for checking the temperature sensor may vary and is configured as to not adversely affect the MAC throughput. For example, the temperature sensor may be measured and updated on a per superframe basis. Also, given that the fine transmit power adjustment is done at the baseband, the temperature compensation algorithm that follows may be executed on every channel change to ensure that the baseband registers are set to the default values. Alternatively, multiple temperature readings may be averaged if sufficient time is available.

The method 500 continues with step 506 in which the transmitting device 120 determines if there is a change in the transmit power level associated with the current sensor reading. For example, the temperature sensor checks whether the current temperature of the RF subsystem 320 has changed from the recorded temperature that was stored in memory 340 during calibration. As previously described, the default/calibration values that were determined during calibration also included a temperature of the RF subsystem 320. The memory 340 of the transmitting device 120 includes a data table that represents certain characteristics of the RF subsystem 320. For example, the data table includes the relationship between the power output of the VGA 322 over a temperature range (e.g., power output vs. temperature curve). If the temperature sensor determines that there has been an increase in temperature, the corresponding change in the transmit power level can be determined via the data table.

The method 500 continues with step 508 in which the transmitting device 120 includes software that automatically performs coarse and fine transmit power adjustments as described above in FIG. 4 to compensate for the corresponding change in the transmit power. The amount of compensation may also be frequency dependent as the gain variation is larger for the lower band than for the upper band.

In an alternative embodiment, a power sensor instead of the temperature sensor may be utilized for measuring a power level of the radio signal that is outputted from the VGA. As such, the transmitting device includes software that automatically performs coarse and fine transmit power adjustments as described above in FIG. 4 to compensate for the change in power level of the radio signal. In still another embodiment, a voltage sensor instead of the temperature sensor may be utilized for measuring a voltage level of the radio signal that is outputted from the VGA. As such, the transmitting device includes software that automatically performs coarse and fine transmit power adjustments as described above in FIG. 4 to compensate for the change in the voltage level of the radio signal.

The method 500 continues with step 510 in which the memory 340 of the transmitting device 120 is updated with the current operating values that were determined in the previous steps 504-510. The transmitting device 120 repeats steps 504-510 during operation. It is understood that there may be situations in which the temperature is not updated for any variation as there may be errors in the DAC output and/or oscillations. For example, the memory 340 may not be updated unless there is at least 0.25 to 0.5 dB expected change in the transmit power level.

Although embodiments of the present disclosure have been described in detail, those skilled in the art should understand that they may make various changes, substitutions and alterations herein without departing from the spirit and scope of the present disclosure. It is understood that various different combinations of the above-listed embodiments and steps can be used in various sequences or in parallel. Furthermore, features illustrated and discussed above with respect to some embodiments can be combined with features illustrated and discussed above with respect to other embodiments. Accordingly, all such modifications are intended to be included within the scope of this invention.

What is claimed is:

1. A method for precise transmit power adjustment of a radio signal, the method comprising:
    coarse adjusting a power level of the radio signal by adjusting a gain setting of an amplifier that is used to power the radio signal; and
    fine adjusting the power level of the radio signal by adjusting a voltage level of an information signal that is provided to the amplifier so that the power level of the radio signal approaches a maximum allowable power level.

2. The method of claim 1, wherein the fine adjusting the voltage level of the information signal includes adjusting an output voltage level of a digital-to-analog converter (DAC), the DAC is configured to generate the information signal.

3. The method of claim 1, wherein the fine adjusting the voltage level of the information signal includes scaling a digital baseband signal that is provided to a DAC, the DAC configured to generate the information signal from the digital baseband signal.

4. The method of claim 3, wherein the scaling is performed via a digital multiplier.

5. The method of claim 1, further comprising:
    detecting by a sensor a change in the power level of the radio signal during operation; and
    performing coarse and fine adjustments to the power level of the radio signal to compensate for the change in the power level of the radio signal during operation.

6. The method of claim 5, wherein the detecting by the sensor the change in the power level of the radio signal during operation includes:
    detecting by a temperature sensor a change in an operating temperature of the amplifier; and
    determining, via a data table, the change in the power level of the radio signal that corresponds to the detected change in the operating temperature of the amplifier;
    wherein the data table includes data representing the output power level of the amplifier over a temperature range.

7. The method of claim 5, wherein the detecting by the sensor the change in the power level of the radio signal during operation includes:
    wherein the detecting by the sensor the change in the power level of the radio signal during operation includes detecting by a voltage sensor a change in a voltage level of the radio signal during operation; and
    determining the change in the power level of the radio signal that corresponds to the detected change in the voltage level of the radio signal.

8. The method of claim 5, wherein the detecting by the sensor the change in the power level of the radio signal during operation includes detecting by a power sensor the change in the power level of the radio signal during operation.

9. The method of claim 1, wherein the amplifier is configured to include an output power level with a dynamic range of about 20 dB and a step size of about 1-2 dB.

10. The method of claim 9, wherein the fine adjusting the power level of the radio signal includes a gain resolution of about 0.04 to 0.25 dB step size.

11. The method of claim 1, wherein the radio signal is an orthogonal frequency-division multiplexed (OFDM) signal.

12. A non-transitory computer-readable medium having computer-executable instructions for precise transmit power adjustment of a radio signal, comprising:
    instructions for coarse adjusting a power level of the radio signal by adjusting a gain setting of an amplifier that is used to power the radio signal; and
    instructions for fine adjusting the power level of the radio signal by adjusting a voltage level of an information signal that is provided to the amplifier so that the power level of the radio signal approaches a maximum allowable power level.

13. The non-transitory computer-readable medium of claim 12, wherein the instructions for fine adjusting the voltage level of the information signal includes adjusting an output voltage level of a digital-to-analog converter (DAC), the DAC is configured to generate the information signal.

14. The non-transitory computer-readable medium of claim 12, wherein the instructions for fine adjusting the voltage level of the information signal includes scaling a digital baseband signal that is provided to a DAC, the DAC configured to generate the information signal from the digital baseband signal.

15. The non-transitory computer-readable medium of claim 12; further comprising:
    instructions for detecting by a sensor a change in the power level of the radio signal during operation; and
    instructions for performing the coarse and fine adjustments to the power level of the radio signal to compensate for the change in the power level of the radio signal.

16. The non-transitory computer-readable medium of claim 15, wherein the instructions for detecting by the sensor the change in the power level of the radio signal during operation includes:
    instructions for detecting by a temperature sensor a change in an operating temperature of the amplifier; and
    instructions for determining, via a data table, the change in the power level of the radio signal that corresponds to the change in the operating temperature of the amplifier;
    wherein the data table represents an output power level of the amplifier over a temperature range.

17. The non-transitory computer-readable medium of claim 15, wherein the instructions for detecting by the sensor the change in the power level of the radio signal during operation includes:
   instructions for detecting by a voltage sensor a change in a voltage level of the radio signal during operation; and
   instructions for determining the change in the power level of the radio signal that corresponds to the detected change in the voltage level of the radio signal.

18. The non-transitory computer-readable medium of claim 15, wherein the instructions for detecting by the sensor the change in the power level of the radio signal during operation includes detecting by a power sensor the change in the power level of the radio signal during operation.

19. The non-transitory computer-readable medium of claim 12, further comprising:
   instructions for determining a change in the power level of the radio signal when switching from a first antenna to a second antenna for transmitting the radio signal; and
   instructions for compensating for the change in the power level corresponding to the switch.

20. A system for precise transmit power adjustment, comprising:
   a digital multiplier for providing a digital baseband signal;
   a digital-to-analog converter (DAC) coupled to the digital multiplier, the DAC receiving the digital baseband signal and generating an information signal;
   an amplifier coupled to the DAC, the amplifier receiving the information signal and powering a radio signal, the amplifier having a gain setting that controls an output power level of the amplifier; and
   a memory having instructions for coarse adjusting a power level of the radio signal by adjusting the gain setting of the amplifier, and instructions for fine adjusting the power level of the radio signal by adjusting a voltage level of the information signal so that the power level of the radio signal approaches a maximum allowable power level.

21. The system of claim 20, further comprising at least one antenna coupled to the amplifier, the at least one antenna configured to transmit the radio signal;
   wherein the memory further includes instructions for determining a change in the power level of the radio signal when the system switches from a first antenna to a second antenna for transmitting the radio signal, and instructions for compensating for the change in the power level corresponding to the switch.

22. The system of claim 20, wherein the memory having instructions for fine adjusting the power level of the radio signal includes instructions for fine adjusting the power level of the radio signal by adjusting an output voltage level of the DAC.

23. The system of claim 20, wherein the memory having instructions for fine adjusting the power level of the radio signal includes instructions for fine adjusting the power level of the radio signal by scaling the digital baseband signal via the digital multiplier.

24. The system of claim 20, further comprising a sensor for detecting a change in the power level of the radio signal during operation;
   wherein the memory further includes instructions for coarse and fine adjustments to the power level of the radio signal to compensate for the detected change in the power level of the radio signal during operation.

25. The system of claim 24,
   wherein the sensor includes a temperature sensor for detecting a change in an operating temperature of the amplifier;
   wherein the memory further includes instructions for determining, via a data table, the change in the power level of the radio signal that corresponds to the detected change in the operating temperature of the amplifier; and
   wherein the data table represents a relationship between the output power level of the amplifier over a temperature range.

26. The system of claim 24, wherein the sensor includes a power sensor for detecting the change in the power level of the radio signal during operation.

27. The system of claim 24,
   wherein the sensor includes a voltage sensor for detecting a change in a voltage level of the radio signal during operation; and
   wherein the memory further includes instructions for determining the change in the power level of the radio signal that corresponds to the change in the voltage level of the radio signal.

28. The system of claim 20, wherein the amplifier is configured to have an output power level with a dynamic range of about 20 dB.

29. The system of claim 20, wherein the radio signal is an orthogonal frequency division multiplexed (OFDM) signal.

30. An apparatus for precise transmit power adjustment of a radio signal, comprising:
   means for coarse adjusting a power level of the radio signal by adjusting a gain setting of an amplifier that is used to power the radio signal; and
   means for adjusting the power level of the radio signal by adjusting a voltage level of an information signal that is provided to the amplifier so that the power level of the radio signal approaches a maximum allowable power level.

* * * * *